United States Patent [19]

Genuit

[11] Patent Number: 4,672,569

[45] Date of Patent: Jun. 9, 1987

[54] METHOD AND APPARATUS FOR SIMULATING OUTER EAR FREE FIELD TRANSFER FUNCTION

[75] Inventor: Klaus Genuit, Aachen, Fed. Rep. of Germany

[73] Assignee: Head Stereo GmbH, Kopfbezogene Aufnahme-und Weidergabetechnik & Co., Munich, Fed. Rep. of Germany

[21] Appl. No.: 715,651

[22] Filed: Mar. 25, 1985

[30] Foreign Application Priority Data

Mar. 27, 1984 [DE] Fed. Rep. of Germany ....... 3411235
Mar. 15, 1985 [DE] Fed. Rep. of Germany ....... 3509358

[51] Int. Cl.$^4$ ......................... G06G 7/48; H03G 3/20; H04R 25/00

[52] U.S. Cl. ...................................... 364/801; 381/57; 381/68; 364/806

[58] Field of Search ............... 364/800, 801, 802, 806, 364/807; 381/68, 56, 57, 58, 59, 60

[56] References Cited

U.S. PATENT DOCUMENTS

| | | | |
|---|---|---|---|
| 3,432,618 | 3/1969 | Stewart | 364/801 |
| 3,570,143 | 11/1968 | Paine | 364/802 |
| 4,517,415 | 5/1985 | Laurence | 381/68 |
| 4,581,758 | 4/1986 | Coker | 381/56 |

*Primary Examiner*—Harold Broome
*Assistant Examiner*—Mark Reinhart
*Attorney, Agent, or Firm*—McAulay, Fields, Fisher, Goldstein & Nissen

[57] ABSTRACT

An electroacoustic simulation method and apparatus for imitating electroacoustically the human outer ear having transmission properties corresponding to those of the human outer ear when exposed to sound in the free field is proposed, wherein the physical acoustical causes of the outer ear, the head, the upper part of the body, the pinna rim, and the like, are represented mathematically by simple partial models and approximated in the form of electric circuits containing circuit elements such as high-pass filters, low-pass filters, all-pass filters . . . and the like, with the possibility to vary certain properties of the circuit elements continuously by varying the parameters so that arbitrary directions of sound incidence can be adjusted infinitely in the horizontal and median planes.

4 Claims, 9 Drawing Figures

Fig. 1
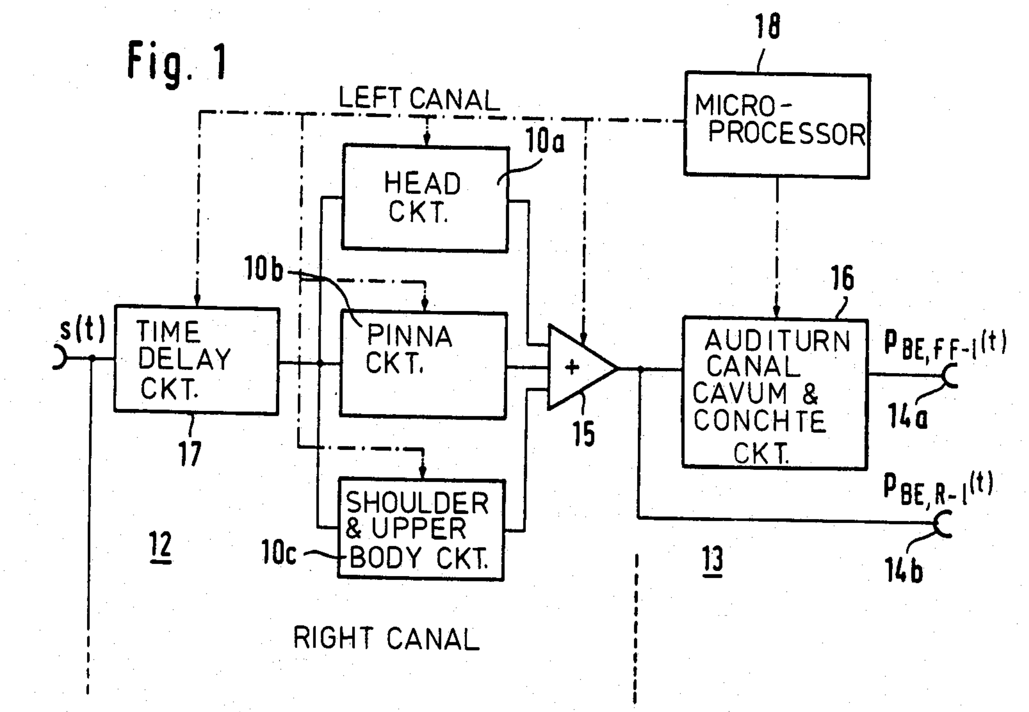
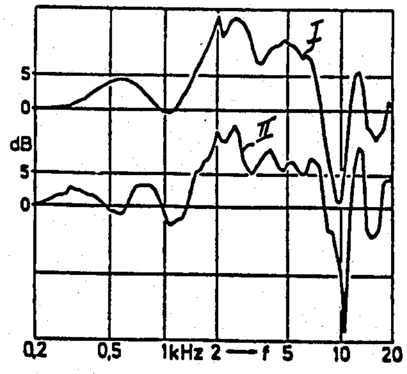
Fig. 2a
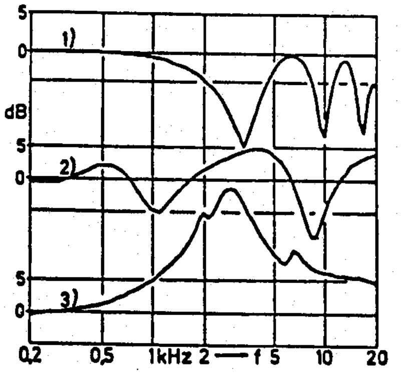
Fig. 2b

METHOD AND APPARATUS FOR SIMULATING OUTER EAR FREE FIELD TRANSFER FUNCTION

BACKGROUND OF THE INVENTION

The present invention starts out from a simulation method and an apparatus of the species described in the main claim and/or the first apparatus claim. Generally, the attempt to substitute electro-acoustic circuits for partial systems of a human outer-ear model has been known heretofore, for example for simulating under headset reproduction conditions those ear signals which may occur under free-field sound propagation conditions when the sound arrives from random directions.

It has also been tried to provide electronic means representing a suitable average outer-ear transmission function for assumed directions of sound incidence—a procedure that can be described as sort of a directional mixer unit. For the purpose of building up and realizing such a directional mixer unit one may for example disregard the real mechanisms by which outer-ear transmission properties are generated—for example because these are unknown—, but determine instead empirically, by measurements taken on a number of test persons, an average outer-ear transmission function for a given, i.e. finite number of discrete directions of sound incidence. The outer-ear transmission functions so determined for the individual directions of sound incidence then permit switching of the "directional mixer unit" to the discrete directions, but has the drawbacks (1) that there has been available to this date no averaging method for outer-ear transmission functions which safely leads to average transmission properties that are really adequate to the information receiver constituted by the "human sense of hearing";

(2) that a finite number only of different directions of sound incidence can be set; and that (3) the input of cost and effort required for this work rises in proportion to the desired number of settable directions of sound incidence.

Another possibility to imitate by electronic means a so-called outer-ear simulator for simulating average outer-ear transmission functions in the time domain would for example consist in averaging and storing in a suitable manner transient responses that have been measured on test persons for all directions of sound incidence, a method which may require extremely large storage capacities, depending on the desired grid pattern. The output signal would in this case be the so-called convolution of the input signal with the two transient responses (for the left and the right ear) valid for the respective direction of sound incidence. Such real-time signal processing is, however, practically impossible because at least the signal processors presently available are capable of performing such signal proceesing only with considerable effort. For the same reason, the possibility of the so-called Fourier transformation of the input signal, followed by multiplication of the corresponding transmission functions and inverse transformation, must also be eliminated.

Although conventional mixer systems are in a position, by means of the so-called panoramic control, to distribute individual microphone signals to the two channels of a stereophonic transmission system so that when reproduced via two loudspeakers provided in the typical stereo arrangement, spatial distribution of aural phenomena between the two loudspeakers occurs (sum localization). However, this method has the disadvantages (1) that the aural phenomena are present only within the space angle determined by the loudspeaker arrangement;

(2) that the height of the aural phenomena is frequently above the connection line between the loudspeakers and dependent on the position of the listener relative to the loudspeakers; and (3) that during headset reproduction the aural phenomena occur as a rule in or on the listener's head because unusual and/or unnatural ear signals are offered to the hearing sense.

Due to these considerable problems and the high technical input required when ear signals are to be reproduced for many directions of sound incidence, there has been available to this day no practically useful form of realization of a so-called electronic artificial head or outer-ear simulator. Now, it is the object of the present invention to break new ground in this field and to provide an outer-ear simulator in the form of a so-called electronic artificial head which is capable, without greater expense, to realize infinite direction setting by amount and phase of all frequencies, giving due regard to the transmission properties of the human outer ear, and which in spite of the simplified structure operates with particularly high accuracy, i.e. which performs the simulation in such a manner that the transmission properties of the electro-acoustic circuit equivalent to the outer ear conform virtually identically to those of the human outer ear under free-field sound propagation conditions.

ADVANTAGES OF THE INVENTION

The present invention achieves this object by the characterizing features described in the main claim and the characterizing features of the first apparatus claim and offers the advantage that ear signals corresponding to any desired direction of sound incidence in the free field can be generated at little expense, for example for headset reproduction purposes. This permits the realization of a natural sound pattern. Another advantage of the invention is to be seen in the fact that although outer-ear transmission functions have exceptionally complex structures—as is well known to the man of the art—, the circuitry required for the practical realization of the outer-ear simulator according to the invention is limited to simple filters, high-pass and low-pass filters and resonance systems, if any. The parameters necessary for setting the circuits during operation, such as amount of a time delay or cut-off frequency of a low-pass filter, can be directly determined from physically established geometrical dimensions with the aid of a model for the analytical description of the outer-ear transmission functions. Apart from the time delays, only few of the filter parameters of the model of the electronic artificial head represented by an electronic circuit vary for the different directions of sound incidence. This makes it possible to simulate a transmission function for a particular direction of sound incidence by determining only a few parameters. In addition, it is also possible, for the purpose of simulating average outer-ear transmission functions, to set up the averaged geometrical characteristic values in a fixed program so that according to a further simplification which is particularly suited for practical use the corresponding control parameters are calculated directly by an electronic logic component, a micro computer or a microprocessor and transferred to the controllable circuit blocks which simulate individual elements of the electronic artificial head. This makes it possible, without great memory requirements, to realize even the finest possible subdivisions of the angular area in both, the horizontal and also the median plane, so that the correct ear signals can be produced for virtually every direction of sound incidence, including the vertical direction in the free field.

The electronic artificial head according to the invention generates ear signals which are familiar to the hearing sense so that on the one hand the localization in the head can be avoided while on the other hand any desired directions of aural phenomena can be adjusted. This opens up absolutely new perspectives not only for artificial-head technology, but also for multiple-track recording techniques. In the field of artificial-head techniques, it is possible with the electronic artificial head to mix signals of supporting microphones spatially correct into the head-related recording. In multiple-track recording techniques, the use of the electronic artificial head makes it possible to convert the signals of individual sound sources in such a manner that the whole range available to the human hearing sense can be used for producing aural phenomena during head-related reproduction. The direction of an aural phenomenon may be changed even during recording which permits to simulate movements of a sound source. The loudspeaker compatibility of the electronic artificial head is comparable to that of artificial-head recording systems since both systems have or approximate mutally equivalent free-field transmission properties.

Further improvements and developments of the invention are laid down in and described by the subclaims. A particular advantage is to be seen in the fact that the firmly stored geometrical characteristic values can be changed so that thereafter other outer-ear transmission functions can be simulated. Further, the outer-ear simulator of the invention can be coupled to an external computer via an interface so that the personal transmission functions of test persons, or else the effects of hearing aids (HDO devices, in-dwelling devices), anomalies of the pinna, or changes of the eardrum impedance can be reproduced electrically.

BRIEF DESCRIPTION OF THE DRAWING

One embodiment of the invention is shown in the drawing and will be described hereafter. In the drawing:

FIG. 1 shows a very schematic block diagram of the outer-ear simulator according to the invention, and indicates also the subdivision into direction-dependent circuit elements and non-direction-dependent circuit elements;

FIGS. 2*a* and 2*b* show curves, as a function of the frequency, of a free-field outer-ear transmission function (I) simulated in accordance with the present invention, as compared to a measured function (II), while the curves (1), (2), (3) represent the simulation of individual acoustically effective parameters, namely the auditory canal (curve 1), the rim formed by the shoulder and pinna (2) and the cavum conchae (curve 3);

DESCRIPTION OF THE EMBODIMENTS

Figure 3:
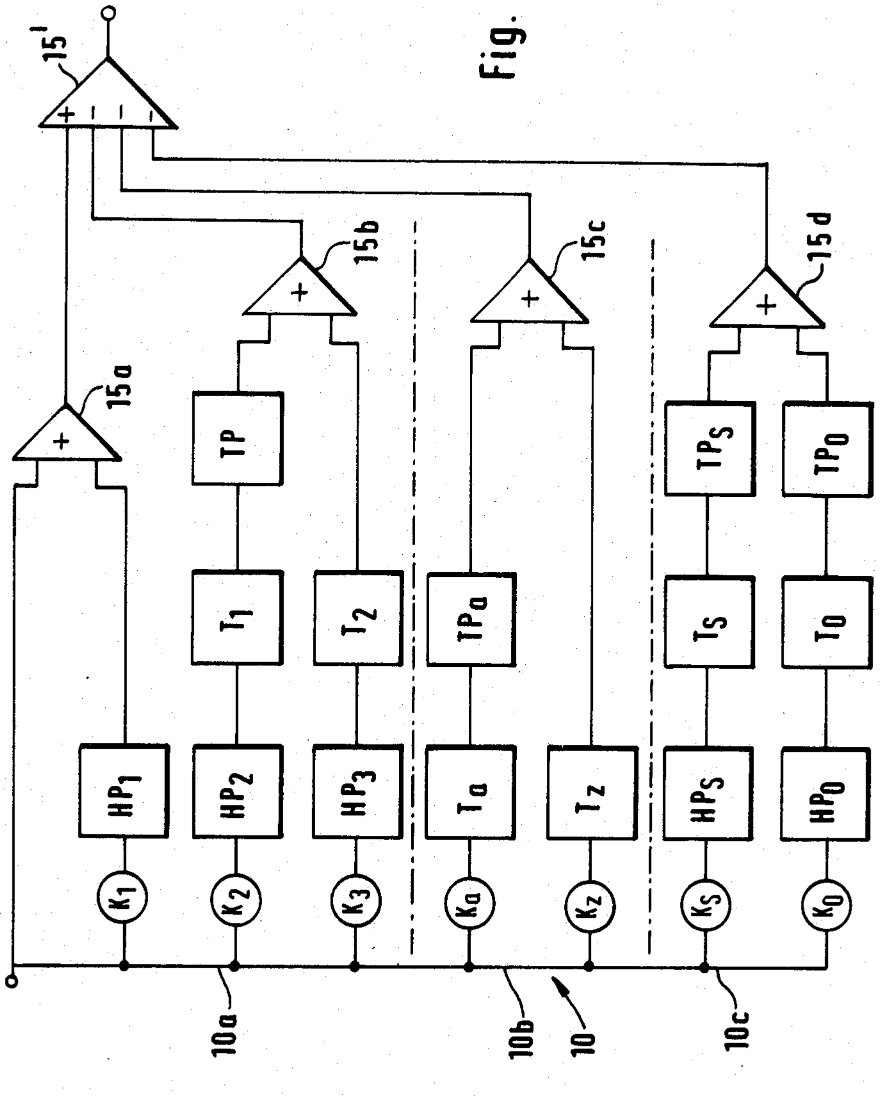
FIG. 3 shows a detailed embodiment, still in simplified form and restricted to the direction-dependent elements for one channel (single-channel block diagram of the outer-ear simulator—directional part)

The basic concept of the present invention consists in that the physical causes of the outer-ear transmission properties are subdivided by discrimination between and reduction to pre-determined and then simplified acoustic elements, such as the upper part of the body, the shoulder, head, pinna with cavum conchae, the auditory canal and eardrum; all these bodies exert different influences on the outer-ear transmission properties, according to their particular geometrical dimensions and depending on the frequency, the resulting transmission function of the outer ear being composed of the complex superpositions of the resonances, reflexions and diffracted waves produced by all partial bodies.

Direction-dependent features are substantially determined by the elements constituted by the upper part of the body, the shoulder and pinna rim. Although basically such dependencies can be calculated (using KIRCHHOFF's diffraction integral, derived from GREEN's theorem), such calculations are unsuited for providing an illustrative representation, which is however required for the description of the average outer-ear transmission function and its simulation in a model as envisaged by the invention.

It is, therefore, significant that the invention parts with the requirement of complicated calculations of complex diffraction integrals and describes diffraction and reflexion on a body with the means of system theory, a step which has to be taken to permit the technical realization of an electronic outer-ear simulator, but which, once taken, permits such realization by comparatively simple means.

From the above it results that the invention does not approach the problem from the empirical point of view, but starts out by regarding and applying the mathematically established, complex diffraction and reflexion conditions and the transmission functions resulting therefrom, and proceeds by transferring them by analytical observation into a (simplified) model which can be represented by electric circuits, wherein the pinna or the head, for example, can then be represented by specific circuits on the basis of an initially mathematical examination of the superposition of several diffraction bodies, the overall outer-ear transmission function being then realized by a complex addition of the individual reflected and diffracted sound components of the corresponding body portions or areas which are simulated by the electric circuit blocks. Any displacements in plane are allowed for by an additional time delay (principle of superposition).

Although it is neither desirable, nor necessary for the understanding of the present invention, to burden the present specification unduely with explanations of complicated mathematical interrelations, the meaning of the above statements will be explained hereafter with the aid of an example. In order to describe, for example, the transmission function of the cavum conchae—which comprises basic resonances and which is in this case direction-independent, just as the influence of the pinna and the ear drum impedance—the cavum conchae may be understood as a system composed of several openings interconnected with and overlapping each other, having the following transmission function:

$$\frac{P_{CC}}{P_0} = \prod_{n=1}^{3} \left[ \cos(kl_n) - \frac{K_1(2kr_n)}{2(kr_n)^2} \sin(kl_n) - j\left(1 - \frac{J_1(2kr_n)}{kr_n}\right) \sin(kl_n) \right]^{-1}.$$

This function comprises so-called Rayleigh-Struve functions described by $K_1$ and so-called Bessel's functions described by $J^1$. Further, $l_n$ defines data corresponding to the length, $r_n$ defines data corresponding to the radius of n openings, and K defines the wave number ($\Omega/c$).

A good approximation of such a transmission function can be achieved by a time delay in conjunction with a resonance system, as follows:

$$\frac{P_{CC\,approx.}}{P_0} = e^{-jk\sum_{n=1}^{3} l_n} \prod_{n=1}^{3} \left(1 + \frac{V_n}{1 + j\Omega_n}\right) \quad \Omega_n = \left(\frac{f}{f_{on}} - \frac{f_{on}}{f}\right) Q_n,$$

wherein $V_n$ is the amplification, $Q_n$ is the quality and $f_{on}$ is the resonance frequency of the opening n, and the parameters of the resonance system—resonance frequency, quality, amplification—are functionally related to the geometric dimensions—radius and depth—of the pinna openings.

Accordingly, the invention is based on the recognition that there exists an interrelation, which can be described mathematically in at least satisfactory approximation—between the outer, acoustically effective geometry of a living person and the measured outer-ear transmission function. Starting out from the average geometrical dimensions, it is therefore possible to determine in this manner, without any additional effort, for every direction of sound incidents an average outer-ear transmission function which represents in a suitable manner the transmission properties required for the human hearing sense because all the properties required for the signal-analysing and pattern-recognition processes in the sense of hearing are allowed for due to the physical interrelation between the outer ear and its transmission properties. The practical realization is then rendered possible by the assumption that these mathematically describable physical causes of the outer-ear transmission properties can be approximated with the aid of a model based on systems (high-pass and low-pass filters, time delay elements, resonance elements, and the like) known from communication engineering. Such a model permits direct approximation of the outer-ear transmission functions on the basis of physical characteristic values, by varying only a few parameters.

The system of the outer ear with its direction-dependent transmission properties describes—using the terminology employed in communications engineering—the frequency-dependent distortions to which the sound signals are subjected in response to the direction of sound incidence during conversion into ear signals for the information receiver constituted by the "human hearing sense".

We are now going to explain by way of an example, namely the head which can be described approximately by an ellipsoid, how diffraction and reflexion can be approximated with the aid of a model.

Reference is made initially to the block diagram shown in FIG. 3 of the directional part of an outer-ear simulator 10—one channel only—where the three parts separated by dash-dotted lines represent the approximation by circuit blocks for the head area at 10*a*, for the pinna area at 10*b* and for the shoulder and the upper part of the body at 10*c*.

Based on the assumption that diffraction and reflexion at a circular disc, for example, can be approximated very well by a simple model consisting of two time-delay elements and one low-pass filter (regarding initially only simple geometrical basic forms), it is assumed for the purpose of approximation of the head model that the sound pressure curve in a given point can be approximated, by the circuit blocks 10*a* of a partial model, to an ellipsoid as head approximation, as a function of the direction of sound incidence, the parameters of this model being functionally related to the geometrical dimensions of the respective body; the parameters consider also special cases such as spherical head, ellipse and circular discs. In all circuit blocks shown, for example in FIG. 3, K designates a coefficient element, T with an index indicates a time delay-element, TP a low-pass filter and HP a high-pass filter. The physical bases of the head model represented at 10*a* are the following: The blocks $K_1$ and $HP_1$ add to the directly incident sound wave the sound field reflected by the ellipsoid (head), regardless of the angle of incidence of the sound. The diffraction field occurring due to the action of the rim is subdivided by components. The branch containing the elements $K_2$, $HP_3$ and $T_2$ represents the diffracted wave components directed towards the location of the sound source, while the branch containing the elements $K_2$, $HP_2$, $T_1$ and TP represents the components directed away from the location of the sound source. The cut-off frequencies of the high-pass and low-pass filters, the time-delay values

TABLE

Geometrical data of 6 male test persons
(m = mean value, σ = standard deviation)

| Ref. | Parameter | | m | σ |
|---|---|---|---|---|
| 1* | Width of shoulder | (mm) | 496 | 28 |
| 2* | Depth of shoulder | (mm) | 269 | 29 |
| 3* | Slope of shoulder | (°) | 23.3 | 2.9 |
| 4* | BP above shoulder | (mm) | 160 | 11 |
| 5* | BP from top | (mm) | 156 | 11 |
| 6* | BP from bottom | (mm) | 105 | 5 |
| 7* | BP from the front | (mm) | 116 | 6 |
| 8* | BP from the rear | (mm) | 102 | 5 |
| 9* | BP angle | (°) | 11.9 | 4.6 |

TABLE-continued

Geometrical data of 6 male test persons
(m = mean value, σ = standard deviation)

| Ref. | Parameter | | m | σ |
|---|---|---|---|---|
| 10* | Width of head | (mm) | 177 | 15 |
| 11* | Height of head | (mm) | 261 | 10 |
| 12* | Depth of head | (mm) | 218 | 6 |
| 13* | Head radius, top | (mm) | 86 | 9 |
| 14* | Centre above BP | (mm) | 70 | 11 |
| 15* | Head radius, bottom | (mm) | 66 | 13 |
| 16* | Centre below BP | (mm) | 25 | 7 |
| 17* | Lateral head radius | (mm) | 109 | 7 |
| 18* | Centre above BP | (mm) | 41 | 13 |
| 19* | Centre laterally of BP | (mm) | 14 | 10 |
| 20* | Width of neck | (mm) | 104 | 8 |
| 21* | Depth of neck | (mm) | 117 | 10 |
| 22* | Neck angle | (°) | 35.9 | 3.1 |
| 23* | Chin in front of BP | (mm) | 94 | 5 |
| 24* | Height of pinna | (mm) | 70 | 6 |
| 25* | Width of pinna | (mm) | 35 | 3 |
| 26* | Slope of pinna | (°) | 12.4 | 5.3 |
| 27* | Centre above BP | (mm) | 13 | 2 |
| 28* | Centre laterally of BP | (mm) | 5 | 1 |
| 29* | Height of cavum conchae | (mm) | 30 | 2 |
| 30* | Width of cavum conchae | (mm) | 21 | 1 |
| 31* | Depth of cavum conchae | (mm) | 19 | 2 |
| 32* | Centre above BP | (mm) | 4 | 1 |
| 33* | Centre laterally of BP | (mm) | 8 | 1 |
| 34* | Head radius top | (mm) | 81 | 11 |

and the coefficients are determined directly by the parameters of head size, direction of sound incidence and position of the entrance of the auditory canal. Just as shown for the head, the influence of the diffraction bodies represented by the shoulder (comprising the elements $K_S$, $HP_S$, $P_S$ and $TP_S$), upper part of the body ($K_O$, $HP_O$, $T_O$ and $TP_O$) and pinna ($K_a$, $T_a$ and $TP_a$ as well as $K_z$, $T_z$) can be described with sufficient accuracy by the model shown in FIG. 3 for the direction-dependent elements.

The table given on the preceding page contains geometrical data of 6 test persons obtained by measurements. These data can be regarded as geometrical mean values for the parameters of the individual approximation elements as shown in FIG. 3 and taken as a design basis for the circuit elements. For the purpose of imitation of average outer-ear transmission functions, the values of the averaged geometrical characteristic values may also be firmly programmed, as will be described in detail further below.

By way of example only and with no intention to restrict the invention in any way, certain mathematical relations will be shown hereafter which illustrate how the parameters used in the model of FIG. 3 (coefficient, time delay, high-pass filter, low-pass filter) are mathematically related—in a simplified manner—with the geometrical dimensions (parameters*) given in the table on page 14.

Pinna:

$$T_a(r_a, r_b, \theta) = T_o \cdot (2 - K_e),\ T_o = r_a/c$$

$$T_z(r_a, r_b, \theta) = T_o K_e$$

$$K_z(r_a, r_b, \theta) = 0.5K\ (1 + |\sin(\theta)|)$$

$$K_a(r_a, r_b, \theta) = 1 - K_z(r_a, r_b, \theta)$$

$$f_{g,TPa}(f, r_a, r_b, \theta) = \frac{2 \cdot c}{x \cdot e}\ |\cot(\arccos(e \cdot \cos(\theta)))|$$

-continued $$\theta = \frac{2 \cdot r_b}{r_a + r_b},\ K_e = e \cdot (1 - |\sin(\theta)|)$$

wherein $\theta$ is the angle of incidence of sound, $r_a$ is half the parameter ref. 24*

$r_b$ is half the parameter ref. 25*

Another example, the head:

$$K_1 = \frac{\cos(\theta) + 0.5 \cdot R/r' \cdot \sin(\theta) \cdot \cos(\theta - \theta')}{|\cos(\theta)| + R/r' \cdot \sin(\theta)}$$

$$K_2 = 0.5 \cdot K \cdot [(1 - \sin(\theta)) \cdot (r' - R)/r' + 0.5 \cdot (1 - \cos(\theta)) \cdot R/(R + r')]$$

$$K_3 = 0.5\ K' \cdot [(1 + \sin(\theta)) \cdot (r' - R)/r' + 0.5 \cdot (1 - \cos(\theta)) \cdot R/(R + r')]$$

$$T_1 = \frac{(r' - R) \cdot (1 - \sin(\theta))}{c} + \frac{R^2 \cdot (\pi - \theta)}{2 \cdot c \cdot r'}$$

$$T_2 = \begin{cases} (r' - R) \cdot \dfrac{(1 + \sin(\theta))}{c} + \dfrac{R \cdot (\pi/2 + \theta)}{c} & -90° <= \theta <= 90° \\ (r' - R) \cdot \dfrac{(1 + \sin(\theta))}{c} + \dfrac{2 \cdot R \cdot (\pi - \theta)}{c} & 90° <= \theta <= 270° \end{cases}$$

$$f_{g,Hp1} = f_{g,Hp2} = \frac{c \cdot R \cdot (2 - \cos(\theta))}{2\pi r'^2}$$

$$f_{g,Tp} = -\frac{2 \cdot c \cdot (\cos(\theta'') + R/r' \sin(\theta))}{(r' + R \cdot \cos(\theta)) \cdot \sin(\theta'')}$$

$$\theta' = \arctan(R/r')$$
$$\theta'' = \arccos(r'/r_a \cdot \cos(\theta))$$

$$r_a = \frac{R_v + R_h}{2},\ r_b = \frac{R_u + R_o}{2},\ r' = \frac{2 \cdot r_a \cdot r_b}{r_a + r_b},\ R = \frac{2 \cdot r' \cdot d}{r' + d}$$

$$K' = \frac{\cos(\theta - \theta') + R/r' \sin(\theta + \theta')}{|\cos(\theta - \theta')| + R/r' \sin(\theta + K\theta')}$$

wherein

R is half the value of ref. 10* of the table $R_v$ is half the value of ref. 7*

$R_h$ is half the value of ref. 8*

$R_o$ is half the value of ref. 5*

$R_u$ is half the value of ref. 6* c is the velocity of sound in air $f_g$ is the cut-off frequency of the respective high-pass or low-pass filter.

To provide a complete description of the properties determining the structure, the influence on the direction-independent elements constituted by the auditory canal and cavum conchae have to be determined as well. The resonance property of this cavity can be approximated very well by band-pass systems in the form of series resonance circuits. The parameters (resonance frequency, quality and amplification) are also functionally related to the geometrical dimensions of the cavity. The auditory canal may be understood as a tube with a complex terminal impedance, namely the eardrum impedance. This system can be described in good approximation by a model consisting of time-delay, high-pass filter and coefficient.

These considerations lead to the greatly simplified block diagram of an outer-ear model shown in FIG. 1, where only the left canal is represented. According to the refinement discussed before and illustrated in FIG. 3, the individual blocks of this model stand for the corresponding acoustic elements which are shown also in FIG. 1, which are found with all living persons and which, accordingly, define the suprapersonal structures of the outer-ear transmission functions. As has shortly been mentioned before, it has been found to be convenient to subdivide the model shown in FIG. 1 into a direction-dependent portion 12 which serves to simulate the directional characteristic of the outer ear, and a direction-independent portion 13 which serves to simulate the free-field outer-ear transmission function. During reproduction via a free-field equalized headset, ear signals corresponding to the ear signals of an "average" test person for the set directions of sound incidence can be produced through the free-field simulation outputs. The second output, designated in FIG. 1 by 14*b*, while 14*a* is the free-field equalized output—serves to simulate the free-field outer-ear transmission functions. The complete, schematically simplified model of FIG. 1 is reduced as regards the necessary circuit components to time delays, simple filters, all-pass filters and adders—although as has been explained before, the outer-ear transmission functions exhibit partly extremely complex structures. The parameters of the circuit components and blocks, such as time-delay values or cut-off frequencies of low-pass filters or the like can be determined directly with the aid of a model for the analytical description of the outer-ear transmission properties from physically pre-determined geometrical dimensions, i.e. from the table given above. This leads to the further, very significant conclusion that by varying or modifying these, or in any case any, predetermined parameters of the circuit blocks shown, it is possible—and this perfectly continuously, as will be understood immediately—to produce the corresponding ear signals for any desired direction of sound incidence in the horizontal and medium planes so that such an electronic artificial head provides a system which is capable of producing, during headset reproduction, ear signals representative of any desired directions of sound incidence under free-field sound propagation conditions and which, accordingly, permits the realization of a particularly natural, impressive sound pattern. Likewise, an improvement of transparency is achieved in the case of loudspeaker reproduction, analogously to artificial head technology. This opens up new possibilities not only as regards special applications in psychoacoustics, which will be discussed further below, but also as regards novel artistic ways of arranging a recording in studio technique.

In the model shown in FIG. 1 comprising the coefficient, low-pass, high-pass, all-pass, band-pass, adder and resonance elements and the like, of one channel only, grouped by circuit blocks, only a few filter parameters will change for the different directions of sound incidence, if one leaves the time-delay elements out of regard. This makes it possible to simulate the transmission function for a given direction of sound incidence by determining these few parameters. In FIG. 1, the individual circuit blocks are designated by 10*a*′ for the head area, 10*b*′ for the pinna and pinna rim, and 10*c*′ for the shoulder and the upper part of the body. An adder element effecting the additive superposition of the respective complex partial transmission functions is designated by the reference numeral 15. The circuit block of the direction-independent portion comprises the auditory canal and cavum conchae areas and is designated by reference numeral 16.

Another advantageous improvement of the present invention consists in that all time delays occurring in the outer ear model are united in one basic time-delay circuit block 17 which is connected before the circuit blocks 10*a*′, 10*b*′ and 10*c*′ and which represents and realizes the necessary signal retardations and time-delays.

Since in this connection the technical realization of the time-delay using analog delay lines may lead to problems for example because mixture products of the frequency in the audible frequency area may occur in addition to an unsatisfactory useful output/noise output ratio, the present invention considers a digital realization of the time-delays in order to obtain a high-quality structure. Basically, this realization is obtained by arranging all time-delay elements associated with individual partial models or circuit element chains in the manner shown in FIG. 1, i.e. in front of the individual other circuits, which permits the use of only one analog-digital conversion. In detail, the basic time-delay block 17 consists of a 16-bit A/D converter operating in the present case at a scanning rate of for example 44 KHz, in which is sufficiently high. After conversion, the quantized scanned values are read into a shift register. The delay-time is then determined by the time difference between the read-in and read-out moments of different storage positions, which in turn is controlled by a microprocessor which will be described further below and which acts as a central control for the individual elements. Due to the short access times, it is possible to read out all storage positions required for delay time simulation (8 delay times per channel—there are one right and one left channel) within a single scanning cycle. The scanned values so delayed can then be output in a time-division mode by a quick D/A converter. Based on this concept, only one or two D/A converters (one for each channel) are required. The filters and coefficients necessary for simulation are realized preferably with the aid of controllable operational amplifiers. This will be explained in detail further below. A digital realization of the filter (for example with quick signal processors) is also imaginable within the frame of the present invention, although it is recommended, at least for the moment, not to make use of this possibility for cost reasons.

As has already been mentioned, the electronic artificial head (outer-ear simulator) is preferably provided with a central control—as shown in FIG. 1—because this facilitates practical handling in a decisive manner. To this end, a microprocessor 18 is provided in which for example those averaged geometrical characteristic values which are required for the imitation of average outer-ear transmission functions may be firmly programmed. The relevant control parameters may then be computed correspondingly by the processor 18 and transmitted directly to the controllable circuit blocks. This method permits to realize even finest subdivisions of the angular area in the horizontal and medium planes, without great demands on storage capacity, so that relevant ear signals can be produced for any direction of sound incidence in the free field. It is in this case additionally possible to change the firmly stored geometrical characteristics values so that other outer-ear transmission functions can be imitated as well. Further, it is also possible to couple the outer-ear simulator of the invention via an interface to an external computer; this possibility is indicated in the detailed representation of FIG. 4 at 19 where the keyboard of an external computer, for example a personal computer, is shown in conjunction with the microprocessor 18'.

The absolutely amazing simulation capabilities of the outer-ear simulator according to the invention is illustrated by the two diagrammatic representations of FIGS. *2a* and *2b* where FIG. *2a* shows a free-field outer-ear transmission function (I) simulated according to the invention—in the present example without simulation of the upper part of the body—compared with a transmission function based on effective measurements, i.e. determined empirically (II), while FIG. *2b* shows in addition the simulation of individual acoustically effective parameters which can be described for example as free-field partial outer-ear transmission functions, for the auditory canal area (1), the shoulder and pinna rim area (2), and the cavum conchae (3). The two partial curves then make up the outer-ear transmission function (I) of FIG. *2a*.

As mentioned before, the individual circuit elements of FIG. 3 represent in greater detail the head, the pinna rim and shoulder/upper body areas of the circuit blocks of FIG. 1; they follow the basic time-delay block 17 realized by the use of digital elements and contain individual adder elements (15*a*, 15*b*, 15*c*, 15*d*) that have not been mentioned before, together with the final adder element 15' with the output connection 20 leading to the direction-independent elements. The circuit elements of FIG. 3 make up the analog portion of the microprocessor-controlled outer-ear simulator, for realization of the coefficients, the high-pass and low-pass filters and of the adder elements combining the output signals thereof.

Figure 4:
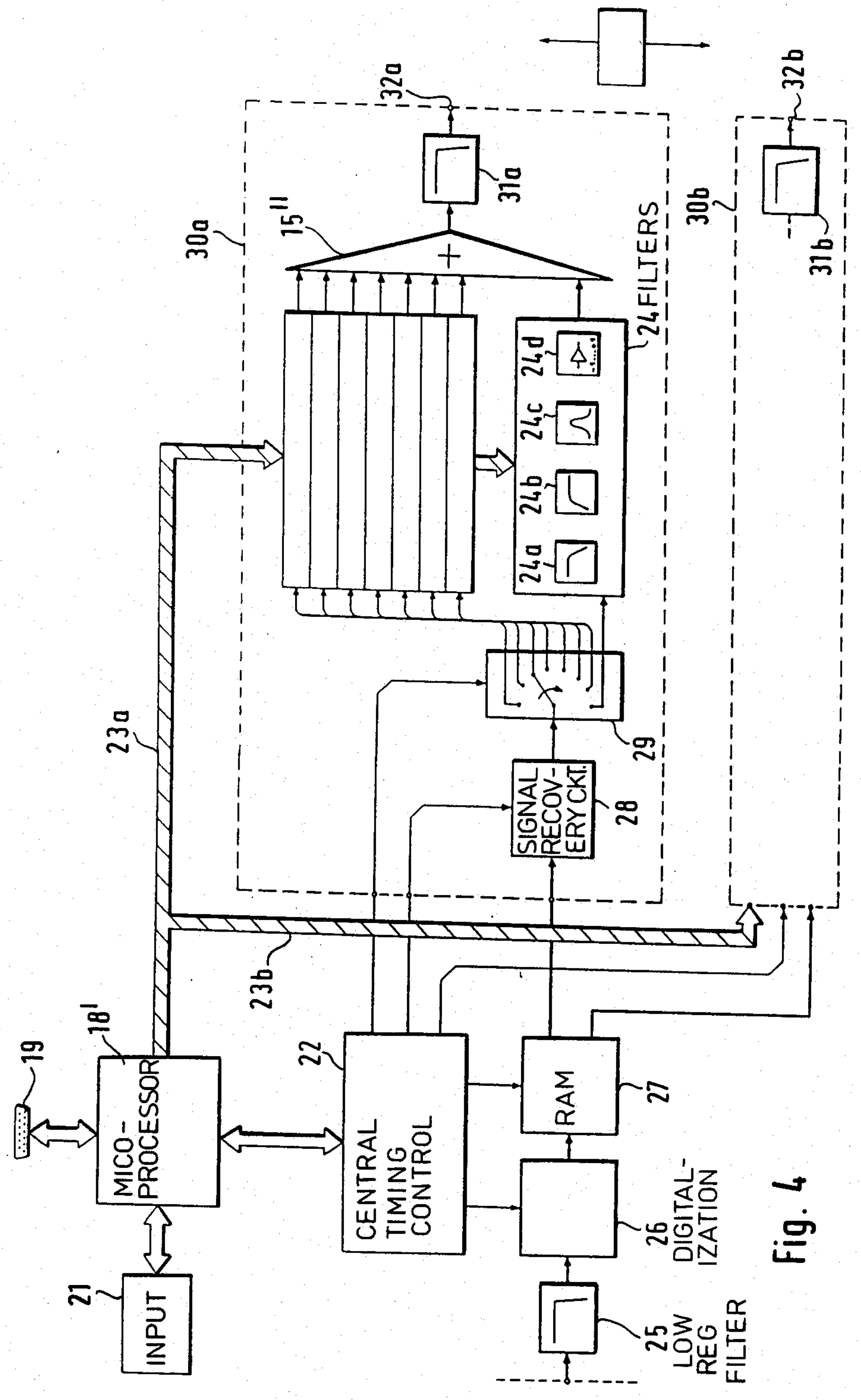
FIG. 4 shows the schematic diagram of one embodiment of the invention suited for practical use, wherein the parameters of the individual circuit elements are controlled by a microprocessor system using stored averaged geometric characteristic values.

The detailed embodiment shown in FIG. 4 represents the schematic diagram of a possible form of realization of an outer-ear simulator according to the present invention, comprising a block 21 which contains operating and input elements and indicators and which is assigned to the microprocessor system 18' which further contains or cooperates with a central timing control 22. The microprocessor influences, via the multiple connection lines 23*a*, 23*b*, the parameters of analog circuit channels 24 of which eight are provided in the present example and which have their outputs connected with the summation element 15''. Depending on the nature and structure of the model, the analog circuit channels 24 contain low-pass and high-pass filters 24*a*, 24*b* of the first and/or third order, band-pass filters 24*c* and so-called coefficient elements 24*d* with an amplification factor of −1 . . . +1. The time-delay elements for the individual channels are realized as digital delay lines and arranged for this purpose in such a manner than only one A/D conversion has to be performed at a digitalization block 26 connected after an input low-pass filter 25. After conversion, the quantized scanned values are read into a freely addressable storage 27 (RAM delay-line storage). The delay times obtained between read-in and read-out of the scanned values at different storage positions determine the time difference, the length of the register being dependent on the delay time maximally required. Considering that storage access is very quick compared with the before-mentioned scanning rate of preferably 44 KHz, all scanned values necessary for simulating the different delay times can be read out in succession during a single scanning cycle. With the aid of a correspondingly quick D/A converter 26 it is, therefore, possible to re-convert the scanned values so obtained for the different time delays in the time-division mode. To this end, a time-division multiplex change-over switch 29 which is controlled by the central timing control and which has its outputs connected to the inputs of the different channels 24 is indicated schematically following a signal recovery block 28. The combination of analog and digital circuit components provides on the one hand the possibility to realize such a system without any problems and ensures, on the other hand, an extremely versatile, high-quality system for simulating the outer-ear transmission functions. Further, reference numeral 30*a* designates in FIG. 4 the—for example—right channel portion, reference numeral 30*b* an associated left channel portion. The adder elements 15' are followed each by a low-pass filter 31*a*, 31*b*, the output 32*a* of the low-pass filter 31*a* supplying the right ear signal and the output 32*b* of the low-pass filter 31*b* supplying the left ear signal.

Figure 5:
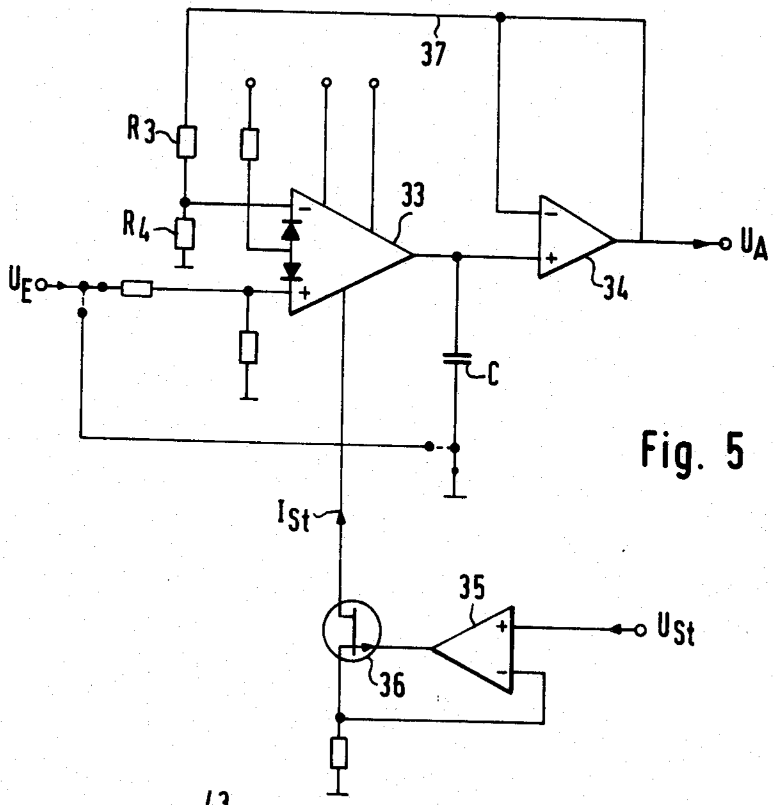
FIG. 5 shows in greater detail one possible embodiment of a voltage-controlled low-pass/high-pass filter of the type that may be used for realizing the electronic artificial head according to the invention.

A possible form of realization of a circuit element which may be designed at desire as low-pass filter or high-pass filter of the first order is shown in FIG. 5. The filter is built by up means of a so-called "operational transconductance amplifier—OTA" 33 which is designed as controllable resistance and in which the forward transconductance is reciprocal to the amplifier and adjustable by means of a direct current $I_{St}$ fed in from the outside. Depending on the feed point of such direct current input signal, the transmission function obtained for the total arrangement is either that of a low-pass filter or that of a high-pass filter. Finally, the OTA 33 is followed by a normal operational amplifier 34. The control current results from the lower circuit portion, the control voltage $U_{St}$ being supplied to an operational amplifier 35 and further, via an FET transistor 36, to the OTA 33. The only other essential components are a capacitor C connected to the feedback branch, and the resistors R3 and R4 provided in the input wiring to the inverting connection and connected to the feedback line 37. A cut-off frequency proportional to the control current $I_{St}$ is obtained in a circuit of this type for example from the following formula:

$$fg = \frac{R4}{R3 + R4} \cdot \frac{I_{St}}{4\pi \cdot U_{St} \cdot C}$$

Altogether, the circuit shown in FIG. 5 provides a voltage-controlled low-pass/high-pass filter element.

Figure 6:
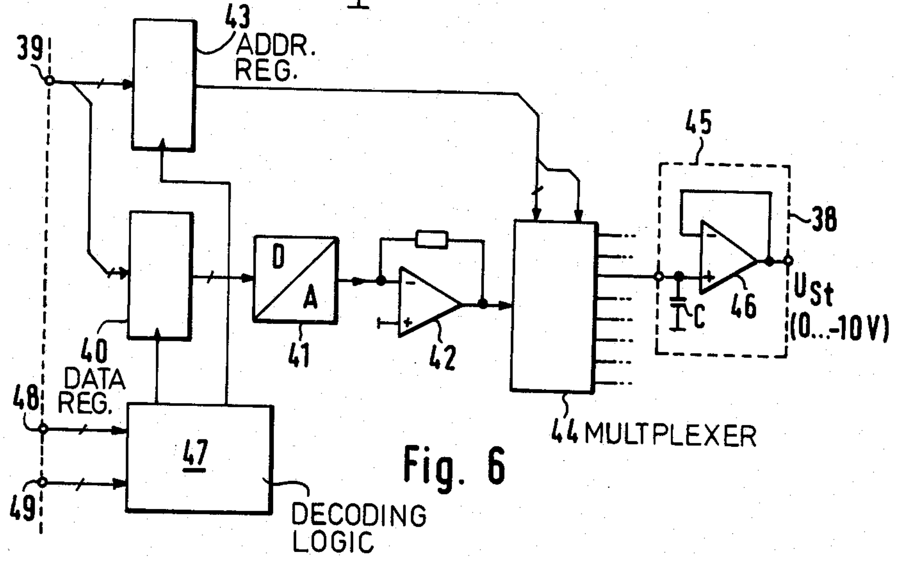
FIG. 6 shows the block diagram of an interface circuit for generating control voltages for the individual circuit blocks for varying the parameters thereof, under the control of a micro processor.

The circuit of FIG. 6 represents a block diagram of an interface circuit for generating the control voltage $U_{St}$ which can be tapped at the output 38 of the circuit and which are required for setting the parameters of the filters and coefficient elements. The microprocessor 18' (FIG. 4) writes the parameter data word via data bus 39 into a data register 40. At the outputs of the data register, the data word is converted by a digital-to-analog converter 41 with connected current/voltage converter 42 into a voltage of, say, 0 . . . −10 V. Then one channel of an analog multiplexer 44 connected to the output of the current/voltage converter 42 is addressed via an address register 43 which is activated by the same data bus, whereby the voltage so generated is supplied to a corresponding output storage circuit (sample+hold), a separate S+H circuit 45 being provided for each filter element to be controlled. The sample+hold circuit 45 consists merely of a storage capacitor C and a very high-ohmic voltage follower 46 as operational amplifier. When the capacitor C is charged, the channel is cut off by an inhibit signal from the address register 43. The whole process takes place cyclically in all other channels as well. Thus, the voltages present at the holding capacitors C are constantly refreshened. An additional decoding logic 47 generates the charging pulses for the two registers 43 and 40 with the aid of address bus input lines 48 and control bus input lines 49 from the microprocessor system 18'.

Figure 7:
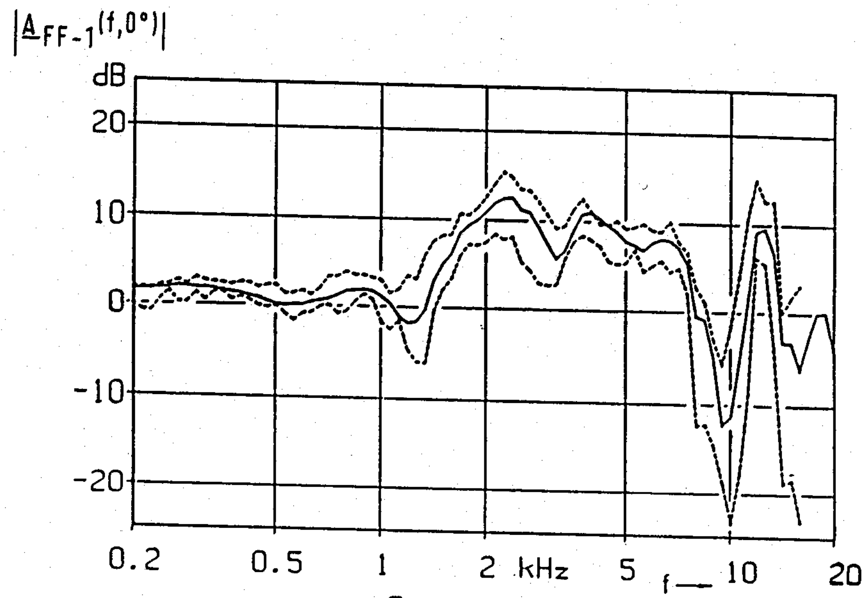
FIGS. 7 and 8 show in diagrammatic form the curves of free-field outer-ear transmission functions (here of the left ear) of a living test person in the free field (horizontal plane), for two different angles of sound incidence, the full-line curve representing the function calculated with the aid of the model realized by the invention, and the functions shown in dotted lines representing the standard deviation of a pre-determined number of measurements performed on the same test person.
Figure 8:
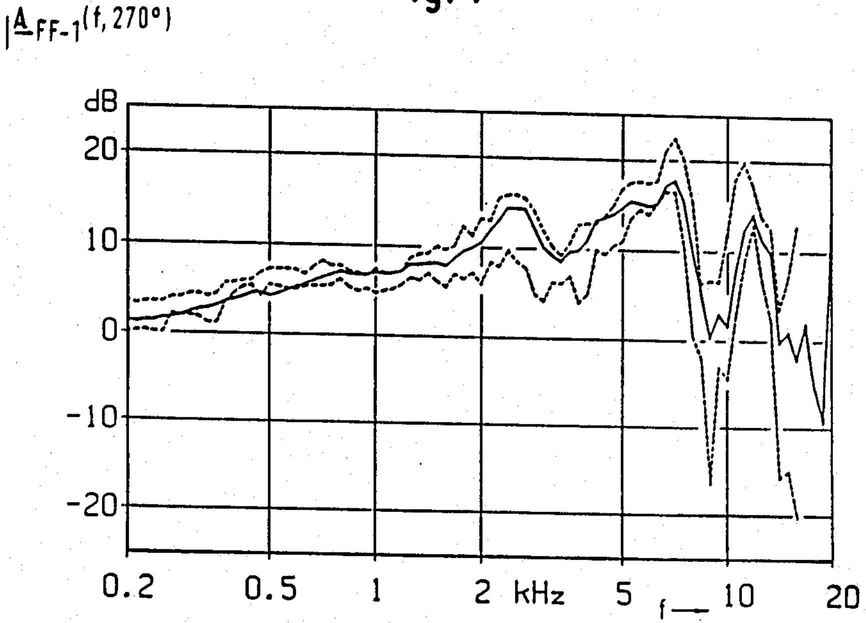

Finally, FIGS. 7 and 8 show diagrams of the free-field outer-ear transmission functions of the left ear of a living test person in the free field (horizontal plane) for two different directions (0°0 and 270°), the full line representing the curve obtained by calculation according to the subject-matter of the present invention (model) and the two dotted lines extending above and below the said full line representing the standard deviation of six measurements performed on the same test person. It will be noted that the present invention achieves its object, namely the realization of an electronic artificial head, with extreme accuracy.

Particularly suitable applications for the electronic artificial head according to the invention, which can be substituted for the natural outer ear for the purpose of transforming sound signals and ear signals, are seen, among others, in the following three fields:

(1) In the field of psychoacoustic research, for easy realization of special outer-ear transmission properties, for example for simulating a hearing aid application. Since individual parameters can be changed simply and extremely quickly, it is for example possible to simulate the influence of hearing aids or the effects of monaural or binaural hearing aids in a simple manner.

(2) In the field of medical diagnosis, for examination of the directional audition or of the audibility of speech in a noisy environment. The device of the invention permits, for example, hearing tests, in particular directional hearing tests under free-field conditions, without the necessity to provide a room with low reflexion properties and without considerable input of cost and effort.

(3) In the field of sound engineering, for the synthetic generation of head-related recordings, it being possible to mix in signals for arbitrary directions of sound incidence, for example artificial head recordings or the like.

All features mentioned or shown in the above description, the following claims and the drawing may be essential to the invention either alone or in any desired combination thereof.

I claim:

1. A method for electroacoustically simulating the free field transfer function of the human outer ear, comprising: determining individual partial outer-ear transmission functions for at least the head and pinna; approximating each partial outer ear transmission functions by magnitude and phase functions; and simulating each partial transmission function with electric circuitry to generate signals representative of each magnitude and phase function at the outputs thereof; additively combining the signals of the circuitry; and continuously adjusting the magnitude and phase of the signals to continuously change the direction of sound incidence.

2. The method according to claim 1, wherein the parameters of the circuitry are determined by physically given averaged geometrical dimensions.

3. An apparatus for simulating the free field transfer function of the human ear, comprising: a plurality of electric circuits each generating a signal having a magnitude and phase representing a partial transmission function of the physical acoustic properties of one of the outer ear, the head, the upper part of the body, the pinna rim, the auditory canal and the eardrum; means for additively superimposing the signals of the circuits; and means for continuously changing the magnitude and phase of the signals to continuously change the function of sound incidence.

4. The apparatus according to claim 3, wherein the circuitry comprise filters, resonators, adders and time-delay elements.

* * * * *